US008451145B2

(12) United States Patent
Dias Rodrigues

(10) Patent No.: US 8,451,145 B2
(45) Date of Patent: May 28, 2013

(54) CONSTRUCTIVE DEVICE INTRODUCED INTO A SECURITY KEYBOARD FOR SECURING INFORMATION AND SECRET PROCESSES STORED BY ELECTRONIC MEANS

(76) Inventor: Wagner Dias Rodrigues, Sao Bernardo Do Campo (BR)

(*) Notice: Subject to any disclaimer, the term of this patent is extended or adjusted under 35 U.S.C. 154(b) by 775 days.

(21) Appl. No.: 12/603,265

(22) Filed: Oct. 21, 2009

(65) Prior Publication Data

US 2010/0117871 A1 May 13, 2010

(51) Int. Cl.
*H03M 11/00* (2006.01)

(52) U.S. Cl.
USPC ............................................... 341/22; 341/20

(58) Field of Classification Search
USPC ............................... 341/20–22; 345/168–172
See application file for complete search history.

(56) References Cited

U.S. PATENT DOCUMENTS

| | | | | |
|---|---|---|---|---|
| 5,406,630 | A * | 4/1995 | Piosenka et al. | 380/52 |
| 7,270,275 | B1 * | 9/2007 | Moreland et al. | 235/492 |
| 7,388,484 | B2 * | 6/2008 | Hsu | 340/539.31 |
| 2003/0025617 | A1 * | 2/2003 | Kunigkeit et al. | 341/22 |
| 2008/0278353 | A1 * | 11/2008 | Smith et al. | 341/22 |

* cited by examiner

*Primary Examiner* — Brian Young
(74) *Attorney, Agent, or Firm* — John Alumit

(57) ABSTRACT

CONSTRUCTIVE DEVICE INTRODUCED INTO A KEYBOARD FOR SECURITY OF INFORMATION AND SECRET PROCESSES STORED BY ELECTRONIC MEANS characterized by including a protective mechanism for the keyboard system which makes attacks impossible by mechanical manipulation, mechanical perforation, part separation, chemical short circuits or the insertion of intrusive devices. One of the objectives of this invention is to provide a constructive device for a keyboard in order to impede the insertion of unauthorized access devices into their internal circuits, guaranteeing the internal inviolability of installed equipment at the point of sale and providing a significant increase in the security of the keyboard system.

9 Claims, 2 Drawing Sheets

CONSTRUCTIVE DEVICE INTRODUCED INTO A SECURITY KEYBOARD FOR SECURING INFORMATION AND SECRET PROCESSES STORED BY ELECTRONIC MEANS

CROSS-REFERENCE TO RELATED APPLICATION

This application claims the benefit of the priority filing date in Brazilian Patent Application No. MU 8802356-7 filed on Oct. 21, 2008.

FEDERALLY SPONSORED RESEARCH

None

SEQUENCE LISTING OR PROGRAM

None

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The invention relates to the protection of information and secret processes stored by electronic means against unauthorized access.

Point of sale terminals (POS, PDV, Pinpad, encrypted keyboard) allow clients to pay their bills using several payment methods, such as credit cards, debit cards, and smart cards. To ensure that payment information is not intercepted from a sales point terminal to a payment center, such information is normally encrypted and protected during transmission, through the use of, for example, digital authentication technology. However, confidential payment information keyed in by the user at a Point of Sale terminal could be intercepted by a physical violation of the Point of Sale terminal. To impede any violation and consequent digital information interception, the keyboard in question is assembled in such a way as to guarantee the inviolability of its internal content, setting off an intruder alarm. The intruder alarm may be triggered by front, rear or side manipulation, or by mechanical perforation of any internal part of the keyboard or of the circuits activated by its keys.

Said intrusion alarm sets off a security mechanism which destroys stored information. Most solutions currently employed do not have a security mechanism for the detection of intrusion circuits inserted in the keyboard. The security mechanism is based on circuits mounted externally on the printed circuit board where the keyboard buttons are to be operated, thereby closing the exposed terminals.

The standard activating mechanism of a keyboard system consists of a rigid printed circuit board containing a demarcated area and two open and exposed terminals connected to an electronic circuit, which in turn detects the closure of these contacts. Each keyboard is connected to a conducting element in the face around the contacts in such a way that, when the keys are pressed, the conducting element touches the two contacts, thereby closing them in a circuit and allowing the keyboard processor to decode any key operated.

An observed disadvantage in conventional solutions is that they allow for the introduction of a device between the circuit board and the keyboard button that would detect the pressing sequence of the keys, and allowing the capture of personal identity numbers (PIN) and other secret information of the user.

One of the objectives of this invention is to provide a constructive device for a keyboard in order to impede the insertion of unauthorized access devices into their internal circuits, ensuring the internal inviolability of installed equipment at the point of sale terminal and increasing the security of keyboard systems.

SUMMARY

A constructive device introduced into a keyboard for security of information and secret processes stored by electronic means characterized by including a protective mechanism for the keyboard system which makes attacks impossible by mechanical manipulation, mechanical perforation, part separation, chemical short circuits or the insertion of intrusive devices. One of the objectives of the invention is to provide a constructive device for a keyboard in order to impede the insertion of unauthorized access devices into their internal circuits, ensuring the internal inviolability of installed equipment at the point of sale terminal and significantly increasing the security of the keyboard system.

FIGURES

DESCRIPTION

Figure 1:
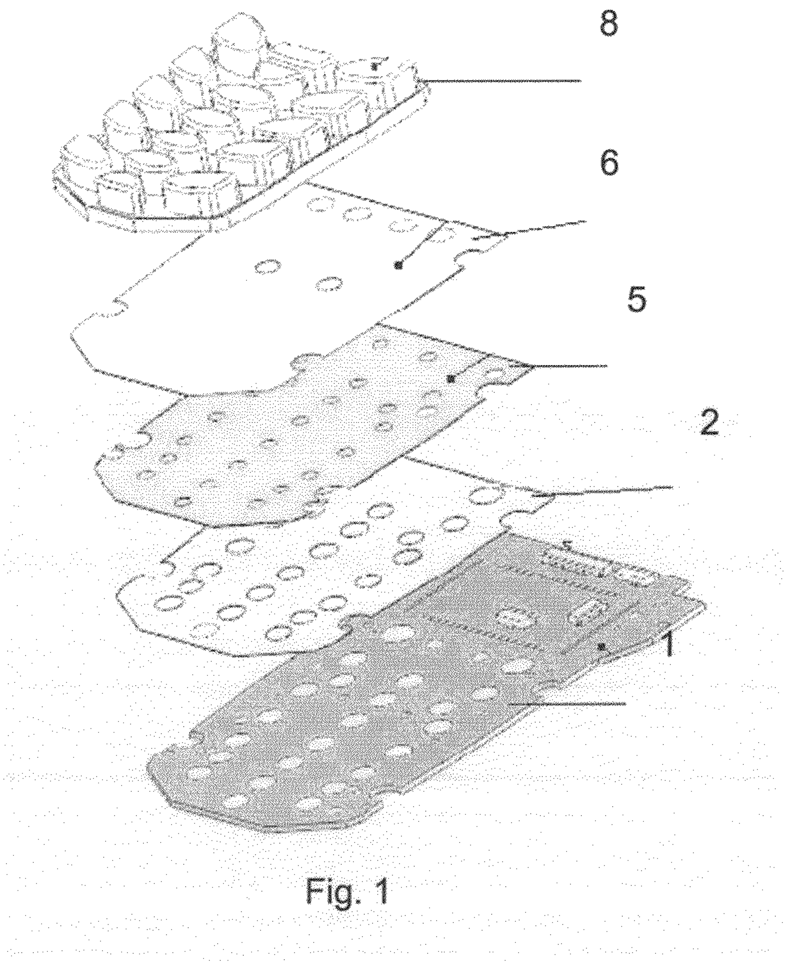
FIG. 1 illustrates an exploded perspective view of the keyboard circuit layers.
Figure 2:
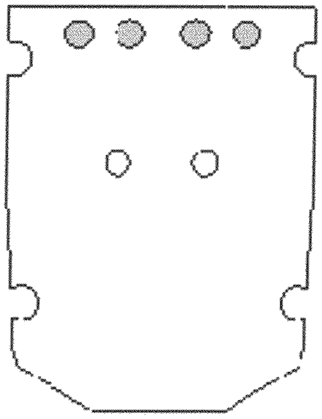
FIG. 2 illustrates a front view of the upper face of the malleable electronic protection board.
Figure 3:
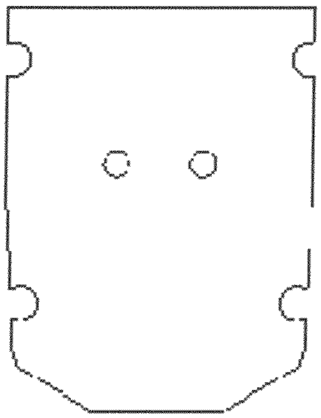
FIG. 3 illustrates a front view of the lower face of the malleable electronic protection board.
Figure 4:
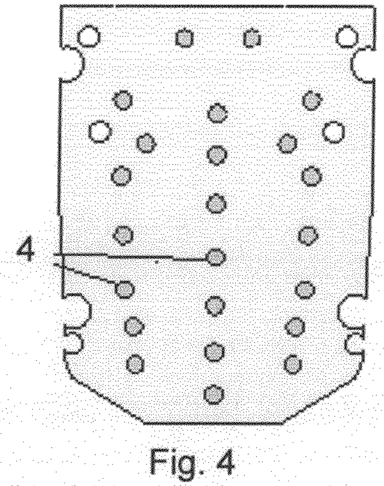
FIG. 4 illustrates a front view of the upper face of the malleable electronic contacts circuit.
Figure 5:
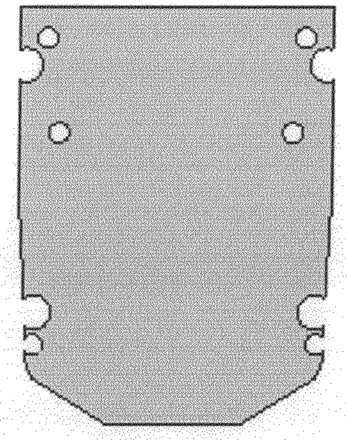
FIG. 5 illustrates a front view of the lower face of the malleable electronic contacts circuit.
Figure 6:
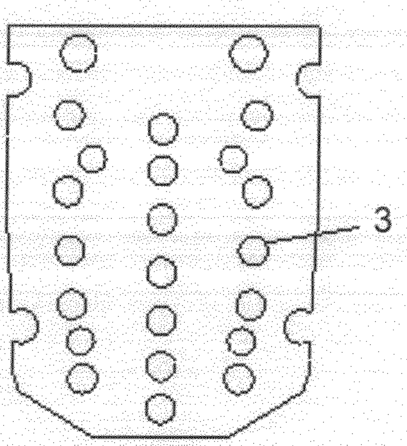
FIG. 6 illustrates a front view of the lower face of the insulating flexible membrane serving the function of a spacer.

In conformity with FIGS. 1 through 6, the security keyboard is made up of a rigid printed circuit (1), having an insulating flexible membrane (2) of a determined thickness with holes (3) located over the position of two exposed contacts (4) of the rigid printed circuit, and serving the function of a spacer, over which the malleable electronic contacts circuit is placed (5), with some conductive material in the lower face, aligned with the exposed contacts (4) of the rigid printed circuit (1), and a keyboard (8) separated from the rest of the assembly by a malleable electronic protection board (6), which indicates any break in its circuit.

Due to the presence of the flexible membrane (2) between the malleable electronic contacts circuit (5) and the rigid printed circuit (1), the conducting material does not close the contacts in spite of the hole present in that position. The mechanical key, in this case, does not have the capability of closing the contact, but presses the conducting material of the malleable electronic circuit on the membrane spacer, deforming it until the conducting material enters into contact with the two exposed contacts (4) and closes the circuit, signaling to the processor element that the contact was closed.

As illustrated in FIG. 1, the first mechanism added to the traditional system refers to the insertion of a malleable electronic protection circuit (6), between the keyboard (8) and the malleable electronic contacts circuit (5) in such a way as to create a physical barrier against mechanical attacks of perforating, obliteration, cutting or short circuiting using chemicals.

The malleable electronic protection board (6) has on both faces, multiple electronic circuits in coil form with a random design running through the circuit surface in a dense physical mesh. On each face of the malleable circuit, there are two independent circuits positioned near each other, whose terminals are linked in a security circuit which, when detecting any anomaly, sets off a security alarm which will trigger the protection and security procedures of the Point of Sale terminal.

From each of these circuits a digital electronic signal is transmitted in wave form and in univocal frequency. The signal is generated by the security circuit which is monitored by the security circuit receiver. In other words, each circuit has a signature permanently monitored by the security circuit.

If there is a perforating type violation attempt which breaks any segment of this circuit, it is immediately detected by the security circuit. If there is a chemical violation attempt by short circuiting the mesh, seeking to make it possible to subsequently break the protection circuit, the alarm will be set off, because there are two circuits with different signatures and the security circuit is not capable of distinguishing the signatures of each circuit in the case of a short circuit in the mesh.

The protection circuits have very complex random designs, in order to make it difficult for a violator to check the circuit visually and find its respective terminals.

The malleable protection circuit has a larger size than the keyboard activating circuits, seeking to completely and physically cover the lower keyboard circuits in such a way as to impede side attacks to the keyboard system.

To impede an attempt to separate the many keyboard system components, usually seeking to insert electronic devices, independent monitoring circuits are positioned, starting at the lower rigid printed circuit and connecting to the ends of the upper invasion monitoring circuit, and returning to the lower rigid circuit in a position diametrically opposite the input.

Again, each circuit has a digital signature with its own frequency and wave form, impeding a crossover short circuit. The mechanical contact between the upper and lower circuits occurs through projections in the keyboard or the lid of the device, which exert enough mechanical pressure to maintain the circuits closed. In an attempt to separate the diverse elements in the keyboard system, these contacts are opened, activating security sensors in the point of sale terminal.

In a preferred embodiment, the separation detection circuits between the keyboard system components can be equipped with an intermediate conductor circuit, which stays closed by mechanical pressure between the mechanical keyboard and the device lid. If an invasion occurs in this secure area, the sensor activates communicating to the processor, which then destroys all the secret information stored in electronic memory. It is then impossible to recuperate the secret information stored in the memory or carry out secret processes, thereby rendering the equipment inoperable.

With regard to the signatures generated by each monitoring mesh circuit, inside the microprocessor there is a true random number generator. The random numbers of this generator are used to create signal forms of amplitude, frequency and phase parameters for the sensor. These signals pass through the sensor group and return to the microprocessor, whose comparing circuits check the referred parameters of the original signals.

Detecting differences in the parameters, the invasion alarm circuit is activated and immediately secret information is destroyed turning the equipment inoperable and making it impossible to recuperate the information.

All features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, paragraph 6. In particular, the use of "step of" in the claims herein is not intended to invoke the provisions of 35 U.S.C. §112, paragraph 6.

Although preferred embodiments of the present invention have been shown and described, various modifications and substitutions may be made thereto without departing from the spirit and scope of the invention. Accordingly, it is to be understood that the present invention has been described by way of illustration and not limitation.

What is claimed is:

1. A constructive device introduced into a security keyboard for securing information and secret processes stored by electronic means, characterized by a rigid printed circuit, an insulating flexible membrane of a determined thickness with holes located over the position of two exposed contacts of the rigid printed circuit, and serving the function of a spacer, a malleable electronic contacts circuit placed over the insulating flexible membrane, with some conductive material in the lower face, aligned with the exposed contacts of the rigid printed circuit, a keyboard, and a malleable electronic protection board that separates the keyboard from the rest of the assembly and which indicates any break in its circuit.

2. The constructive device of claim 1, characterized by including a protective mechanism for a keyboard system which makes attacks impossible by mechanical manipulation, mechanical perforation, part separation, chemical short circuits or insertion of intrusive devices.

3. The constructive device of claim 1, characterized by the insertion of the malleable electronic protective board between the keyboard and malleable electronic contacts circuit in such a way as to create a physical barrier against attacks of the perforating mechanical type, obliteration, cutting or chemical short circuits.

4. The constructive device of claim 3, characterized by the input and output of monitoring points of a same circuit to be positioned diametrically opposite, in a cross form or passed between the circuits, making it impossible to insert intrusive devices in various angles of attack.

5. The constructive device of claim 3, characterized by the fact that said malleable electronic protection circuit has on both faces, a double electronic circuit in coil form with a complex random design running through the circuit surface in a dense physical mesh, each face of the malleable electronic protection circuit having two independent circuits positioned near each other, whose terminals are linked in a security circuit which when detecting any anomaly sets off a security alarm responsible for generating the protection and security procedures of the Point of Sale terminal.

6. The constructive device of claim 1, characterized by the use of a multiple monitoring circuit with a complex random design pattern which makes it difficult to follow circuit logic, making it impossible to visually identify the input and output terminals of each circuit by possible fraudsters.

7. The constructive device of claim 1, characterized by the use of a monitoring circuit of larger dimensions than the lower circuits, forming a protective area, impeding side attacks on the keyboard system.

8. A constructive device introduced into a security keyboard for securing information and secret processes stored by electronic means, characterized by the insertion of a flexible security circuit consisting of diverse traces that delineate circuits whose contacts are maintained closed by projections located in the terminal cabinet of the point of sale terminal and in the mechanical keyboard, in such a way so that any attempt to separate mechanically any component of the keyboard system causes theses circuits to open, setting off a security system, and further characterized by the fact that each circuit has a digital signature with its own frequency and wave form, impeding a crossover short circuit.

9. The constructive device of claim 8, characterized by the fact that said traces are proof against chemical or mechanical attack that causes a short circuit in the monitoring mesh.

* * * * *